United States Patent [19]
Belcher et al.

[11] Patent Number: 5,434,357
[45] Date of Patent: Jul. 18, 1995

[54] REDUCED SEMICONDUCTOR SIZE PACKAGE

[76] Inventors: Donald K. Belcher, 2985 Ranch Rd., West Melbourne, Fla. 32904; Calvin L. Adkins, 3963 Man-O-War La., Palm Bay, Fla. 32905

[21] Appl. No.: 831,252
[22] Filed: Dec. 23, 1991
[51] Int. Cl.[6] .................................. H01L 23/28
[52] U.S. Cl. ............................ 174/52.2; 257/684; 257/685; 257/690; 257/704; 257/787; 361/728; 361/729; 361/735
[58] Field of Search ............... 174/52.2, 52.3, 52.4; 357/74, 70, 72, 75, 80; 257/678, 684, 685, 690, 692, 693, 694, 701, 704, 787; 361/728-729, 730, 735

[56] References Cited
U.S. PATENT DOCUMENTS

| | | |
|---|---|---|
| 3,310,711 | 3/1967 | Hangstefer . |
| 3,922,705 | 11/1975 | Yerman . |
| 4,322,737 | 3/1982 | Sliwa, Jr. . |
| 4,970,577 | 11/1990 | Ogihara et al. . |
| 5,013,871 | 5/1991 | Mahulikar et al. ............ 174/52.4 |
| 5,023,398 | 6/1991 | Mahulikar et al. ............ 174/52.4 |
| 5,025,114 | 6/1991 | Braden ........................... 174/52.4 |
| 5,086,018 | 2/1992 | Conru et al. ................... 437/207 |
| 5,107,074 | 4/1992 | Noll et al. ..................... 174/52.4 |

Primary Examiner—Bot LeDynh
Attorney, Agent, or Firm—Joel I. Rosenblatt

[57] ABSTRACT

A sealed semiconductor unit includes an electrical component within a defined area on a semiconductor material. A cover with the dimensions of the semiconductor defined area is placed over the semiconductor material with a sealant there between. The dimensions of the cover are aligned with the dimensions of the semiconductor. The sealed unit includes electrical contacts extending from outside the sealed unit to the electrical component within the sealed unit on the semiconductor material. The sealed semiconductor unit, including the cover, the semiconductor material, and the electrical component, has an area of the semiconductor material.

2 Claims, 6 Drawing Sheets

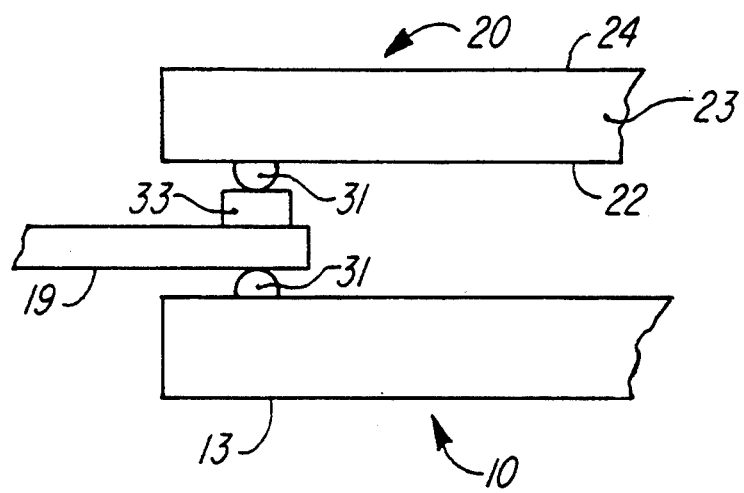
FIG. 7b
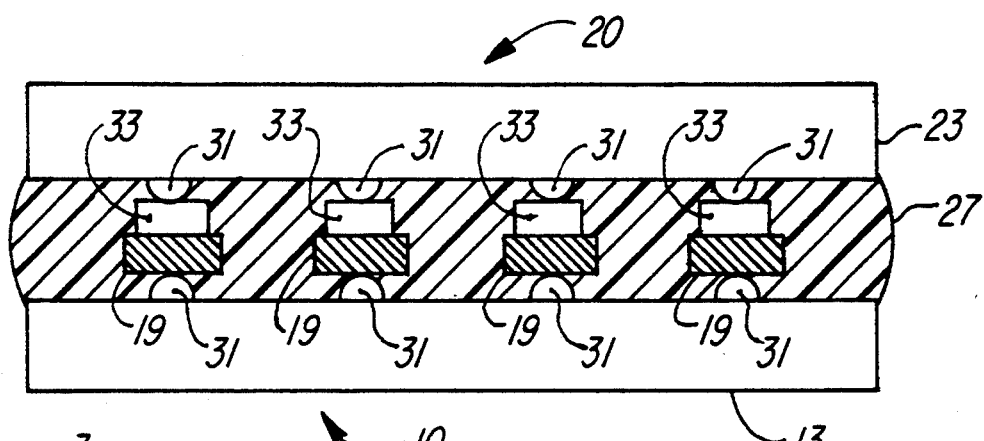
FIG. 7c
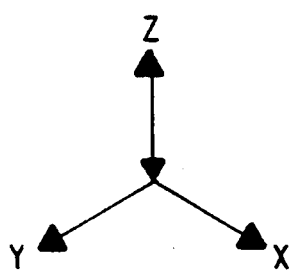

REDUCED SEMICONDUCTOR SIZE PACKAGE

BACKGROUND

The need to continue the reduction of electronic component size has produced successfully refined and more sophisticated levels of integration and advanced die packaging concepts. For example tape automated binding (TAB) is such a well known technique. However, packages for housing integrated circuit die, even with the use of TAB die connects, are still very large relative to the size of the substrate needed to support the operative parts of the semiconductor electrical component. Further, packaging, added to the die, increases the material surrounding the die. This increase in material increases heat transfer resistance and decreases the rate of heat dissipation.

SUMMARY OF THE INVENTION

According to the inventive principles, shown in the preferred embodiment, a completed and sealed electrical component may have its finished surface area substantially limited to the component's surface area. More particularly, in semiconductor die supporting an integrated circuit, the surface area necessary to support the elements of the electrical component on the semiconductor may present the sole limit of the surface area defining the sealed component when the semiconductor die is sealed against the damage from the environment. In accordance with the principles of this invention the defined area of the sealed component may be limited to that area on the semiconductor coextensive with the said component or be in excess of that area.

Accordingly, the principles of the invention may be applied to sealing an electronic component such as an integrated circuit arranged on a defined surface of a semiconductor or any other suitable material and bounded in any geometrical shape and with the finished or sealed component having a size substantially limited to at least the dimensions of the said defined surface. In the case of the preferred embodiment, the component is a circuit formed on a surface of a semiconductor material and forming a die. When completed, the sealed component will show a surface area size substantially that of the die surface area, as it existed prior to sealing.

As is known by those skilled in the art, an electrical component constructed on a semiconductor material has an operative area which may be the whole of the available surface area or a portion of that surface area. It is in this defined area that the electrically active or passive components are placed. For practical use, this surface needs to be covered and sealed so the electrical parts are insulated from environmental damage. At the same time, contacts are required to connect the component electrically with other components located in that same environment and exterior to the electrically operative surfaces within the sealed unit.

In the preferred embodiment, the electrical connections are metal leads bonded to the die at its defined surface and along the edge of that defined surface. The bonding technique used in the preferred embodiment is well known in the art and is not discussed in detail. For example, and without limitation, a bond pad, integral with the die integrated circuit is plated with layers of conductive material such as gold, to form a bump. The bump protrudes above the surface of the die so a contact can be made from the circuit through the bump, to a mating contact, to another connection in another die for example or directly to a second mating die placed in a layered relationship over that first die.

In one example of the preferred embodiment, a cover of a suitable material is cut to fit over the die to cover the defined area on the die. A suitable sealant material such as an adhesive, is used between the covers to seal the component circuit from the environment. The surface area and dimensions of the cover are substantially that of the defined area on the die. A sealant such as an adhesive bead may then be placed on the die or the cover on the surface facing opposite to the defined surface of the die. The sealant may be any electrically purified epoxy adhesive. A suitable epoxy is RJR-4B made by RJR POLYMERS. In the preferred embodiment, the adhesive may be applied to the die in a continuous bead over the die's metal contacts. In other suitable arrangements, the adhesive may be applied through prepared strips having non-conducting adhesive interspersed with conductive adhesive portions, the conductive adhesive used where the electrical connections are required such as where die contacts are placed. The strips are aligned with the contacts in the die and, for example, with contacts for a die in second circuit formed in the cover. The conductive sealant together with the non-conductive sealant then sealing the interior portion between the die and the cover for the second die as the case may be from the environment. A sufficient amount of sealant is applied to cover the contacts and the open spaces or depressions between the contacts. Accordingly, when the cover is positioned with its dimensions aligned with the die's corresponding dimensions and then pressed in contact, the sealant bead forms a seal between the die and the cover. As the cover is sized and shaped to match the surface area of the die, the total surface area of the die with the cover is not increased after the sealing operation, even where a separate circuit is contained within the cover. The sealant may be an adhesive to bond the die and its layered cover or a non-adhesive with other suitable fasteners being used for bonding.

In selecting the cover material, the same semiconductor material as the die may be chosen or a different material having compatible characteristics. For example, the cover material may be chosen to have the same thermal coefficient of expansion. Additionally, to achieve further compatibility, the crystalline structure of the cover and die may be arranged in alignment. The die and cover, in a layered relationship opposite each other and with the space between them sealed by a plastic sealant material, forms a completed electrical package. As contacts are bonded in place to the circuit or circuits, there is no need for additional leads or contacts or lead wires or associated packaging. In this way the size of the finished die and cover is minimized.

From the description of the invention below, it will be understood that the principles of the invention are not limited to any one electrical component or any particular set of materials used in any electrical component.

Accordingly, a method is shown of sealing an electrical component contained within a defined area on the surface of a semiconductor material, comprising the steps of applying a cover to said semiconductor material substantially with its dimensions in alignment with respective dimensions of the said semiconductor defined area, and forcing a sealant into contact with the opposed surfaces of said cover and said defined area to form a seal.

Further as shown, is a product made by the process of sealing an electrical component contained within a defined area on the surface of a semiconductor material, by forming a cover substantially having the said dimensions of said defined area, placing a sealant on the said defined area or on said cover, applying said cover to said substrate substantially with its dimensions in alignment with matching dimensions of the said defined area, and forcing said sealant into contact with opposed surfaces to seal said defined area.

Additionally as shown is a sealed electrical component contained within a defined area on the surface of a semiconductor material, comprising a cover substantially having the said dimensions of said defined area, a sealant on the said area to be sealed or on said cover, said cover being juxtaposed with said semiconductor material substantially with its dimensions in alignment with matching dimensions of the said semiconductor area, said cover applied to said semiconductor material in a layered relationship and defining opposed surfaces on said semiconductor material and on said cover, and said sealant in contact with the opposed surfaces and forming a seal of said defined area.

DESCRIPTION OF THE DRAWINGS

FIG. 7b shows an edge view of the dice of FIG. 7a assembled but without the sealing material, to show the positioning of the contacts of the dice.

FIG. 7c shows an edge view of the dice and cover of FIG. 7a, assembled and environmentally sealed.

DESCRIPTION OF THE INVENTION

Figure 1:
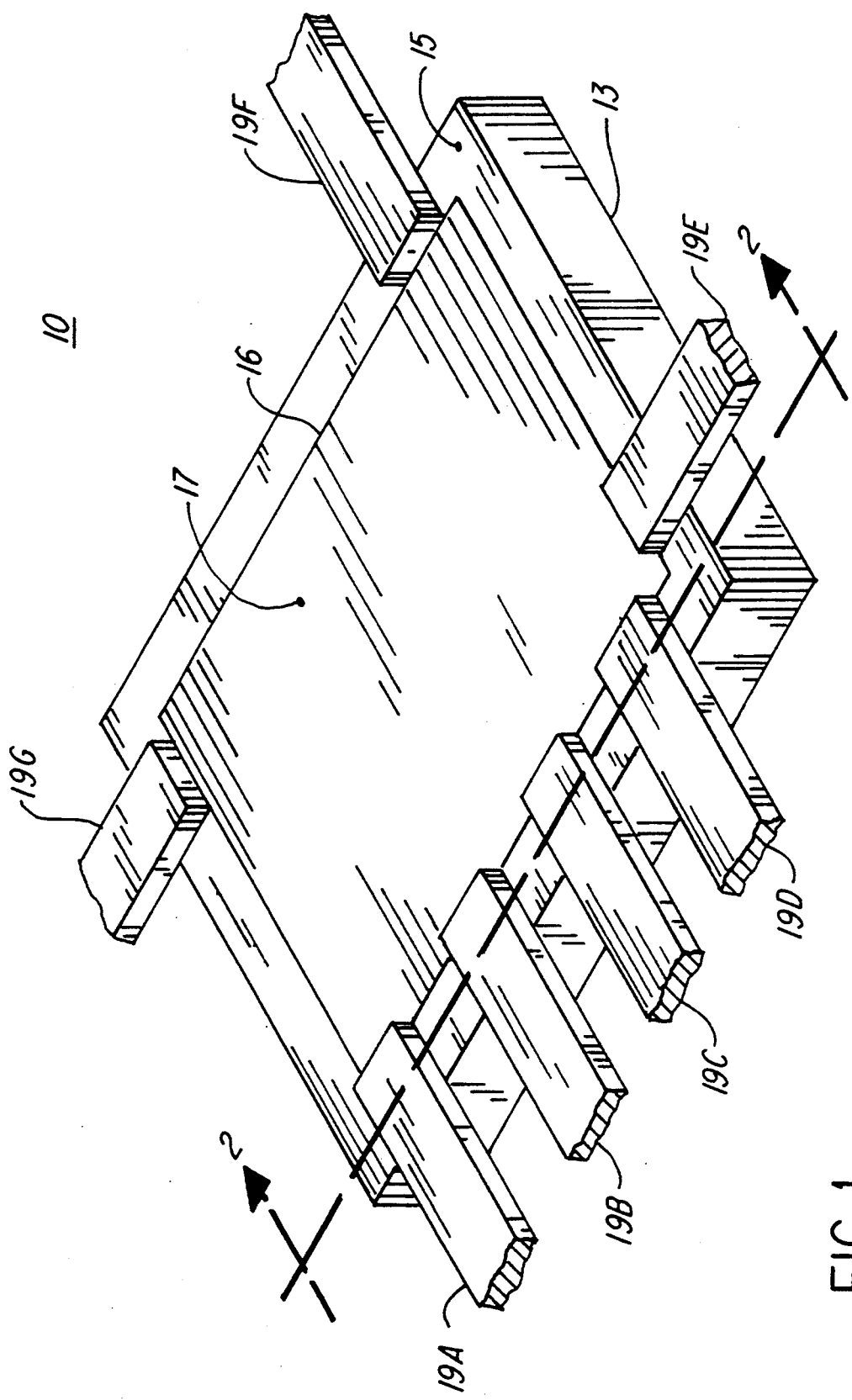
FIG. 1 shows a top view of a semiconductor die containing an electrical component on it surface.
Figure 2:
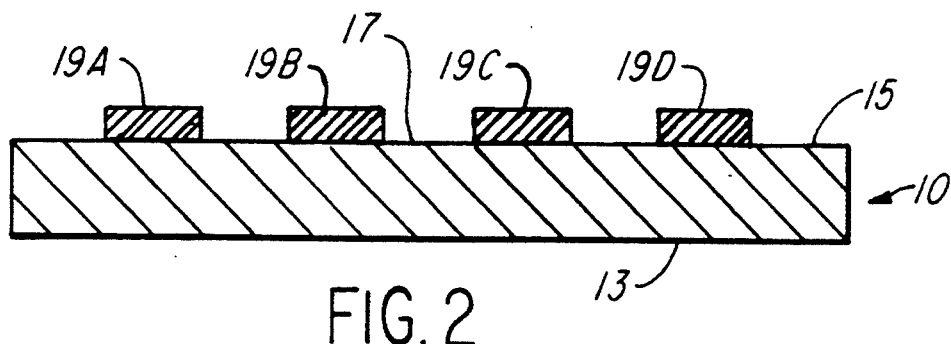
FIG. 2 shows a cross-sectional view of the die of FIG. 1 taken along section line 2—2.

The invention, according to the inventive principles, and the described preferred embodiment is shown with reference to the drawings. FIG. 1 shows in perspective, a semiconductor die 10 which may support or contain an electrical component such as an integrated circuit or a discrete semiconductor device, or any other kind of electrical component, whether active or passive, disposed on upper surface 15 of the semiconductor material 13. Although not illustrated, it should be understood the surface 15 may have a nitride or silica glass overcoat. In this case, the connection to the circuit on the semiconductor surface would be by a bonding pad 18 integral with the circuit and a conductive conduit (not shown), formed by plating for example, through the overcoat to a bump formed on the surface of the overcoat. The electrical component may be constructed using any technique including, without limitation, etching, deposition or printing. In accordance with the present state-of-the-art, the electrical component is contained within surface area 17 bounded by area boundary 16. It may be connected externally of the die 10 by means of leads 19a to 19g, it being understood that the number of leads is shown for illustrative purposes. The invention not being limited to the precise location of the leads or their number. A cross sectional view along edge 21 taken along line 2—2 is shown in FIG. 2. The surface 15 is top most and with contacts 19a through 19d being shown arranged on surface 15. Also indicated by numeral 17 but not shown is the electrical operational area on surface 17.

The area used for tile electrical component is shown within the border 16, in FIG. 1. In the preferred embodiment, the operational area is a rectangle. However it should be understood the principles of the invention may be applied to any shape area on any surface of the component requiring an environmentally sealed cover.

Figure 3:
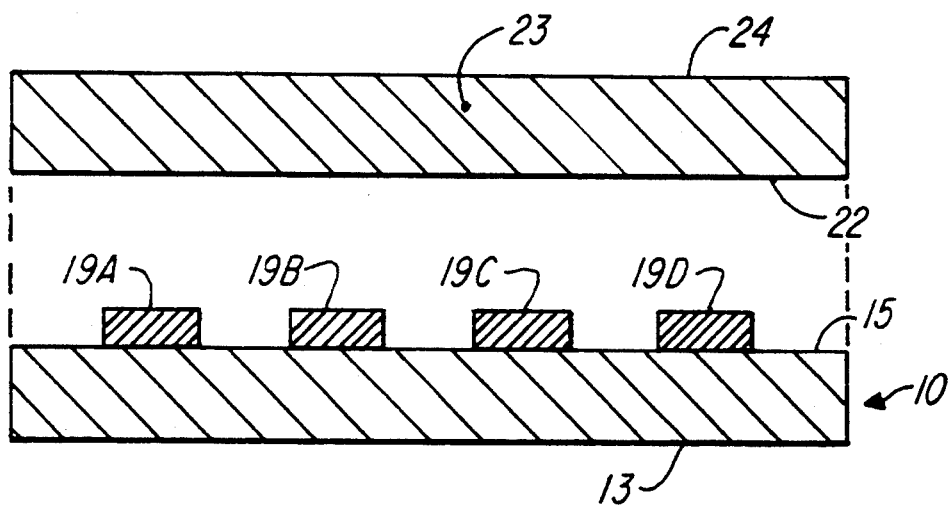
FIG. 3 shows the die of FIG. 2 with a sealing cover in positioned in place in a layered relationship with the die.

FIG. 3 shows a cover 23 having an exterior (upper) surface 24 and an interior (lower) surface 22 positioned over a defined surface 15 of the semiconductor 13 and forming die 10. The cover 23 is shown in alignment with the die 10. In the preferred embodiment and according to the principles of the invention, the cover 23 is of the same area dimensions as the die 10 so when aligned with the die 10, the total surface area of the covered die in substantially that of the uncovered die 10. The cover material may be of the same material or material having selected compatible characteristics. For example, the material selected for the cover could have the same coefficient of thermal expansion so distortions due to different rates of expansion under heating for the die 10 and the cover 23 are avoided. This expansion compatibility be augmented by alignment of crystalline structure in the die 10 and the matching cover 23. The lower surface of cover 23 may have an electrical component formed on it with matching electrical contacts as would be known in the art. In this case, cover 23 would be a second die 20 and dice 10 and 20, when assembled would form an electrical system.

Figure 4:
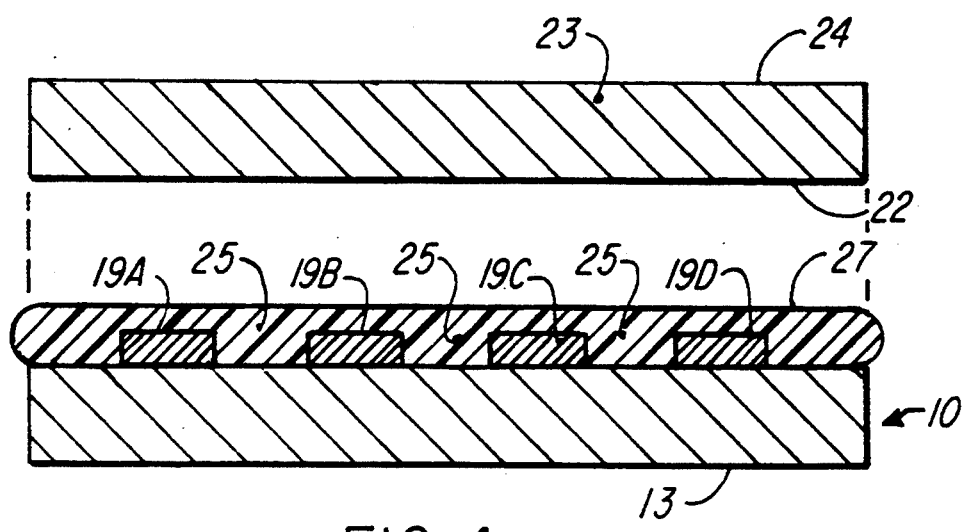
FIG. 4 shows the die of FIG. 2 with the sealant applied to the die surface and the cover positioned in place in a layered relationship for sealing.

Accordingly, as shown in FIG. 4 and with reference to FIG. 1, a bead 27 of a sealant such as a purified epoxy adhesive is placed around the boundary 16 and between the contacts 19. The adhesive fills the voids shown as 25 between adjacent contacts 19 where they extend along the periphery of the electrically operational area 17. In the case of the preferred embodiment, the adhesive bead is placed outside the electrically operational area and on the contacts 19. However, it should be understood, the invention is not limited to this placement but may include placing the adhesive inside the border 16 of the electrically operative area 17 or placement in any manner compatible with the structure and its circuitry.

Figure 5:
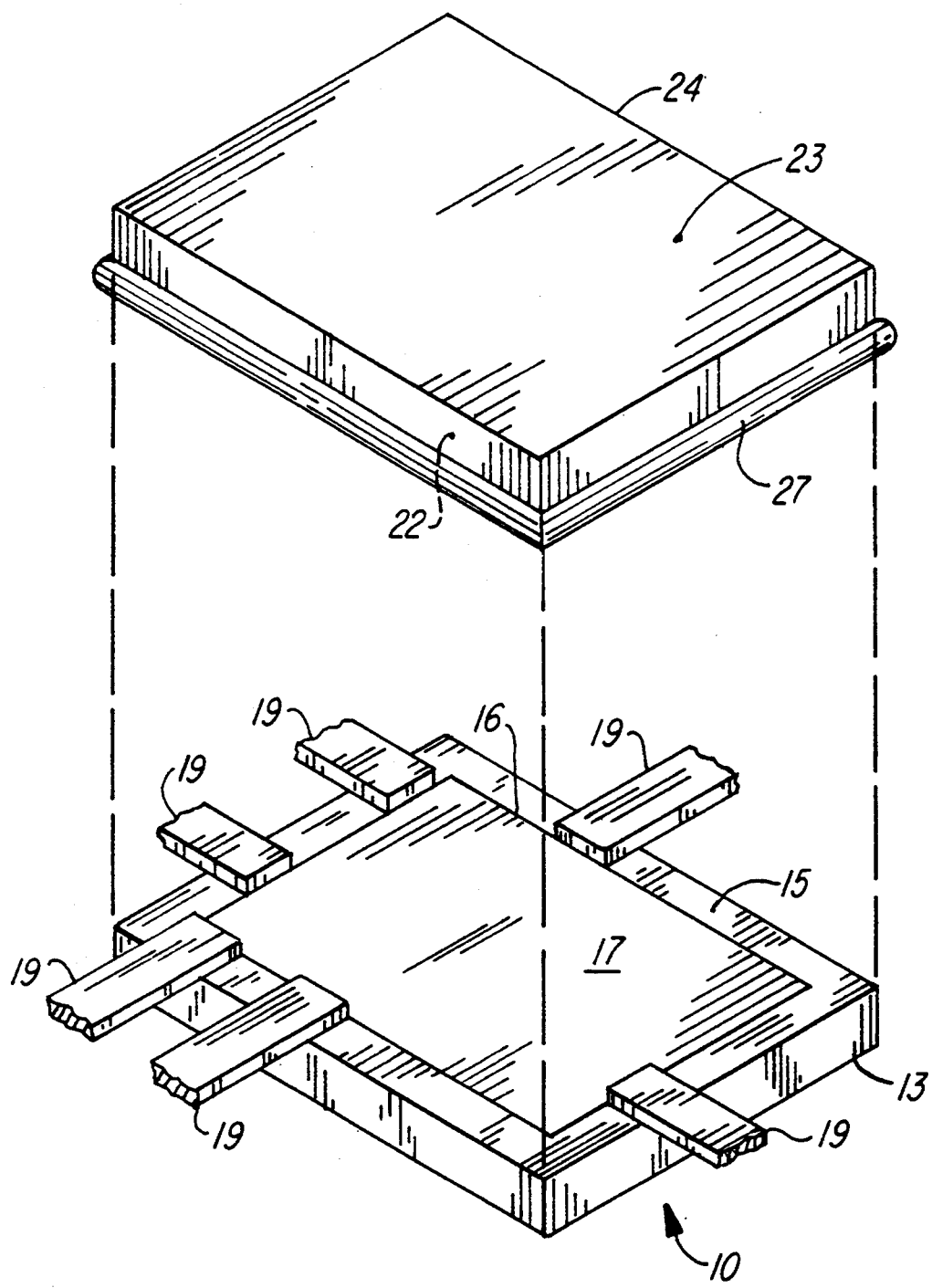
FIG. 5 shows an exploded view the die surface with the sealant applied to the cover.
Figure 6:
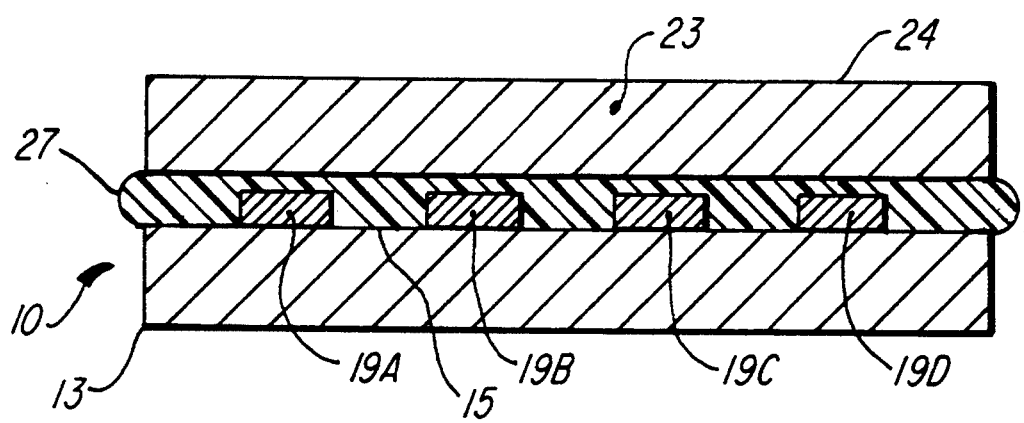
FIG. 6 shows the die in a edge view with its layered cover pressed into place and forming a sealed package with the die and the sealant.

As shown in FIG. 4, the die 10 of FIG. 1 is shown with a bead of adhesive 27 applied about the periphery of the electrically operative area 17. In this application, the bead 27 overlies the contacts 19. The cover of suitable material 23 is shown placed opposite tile electrically operative surface area 17 and in a position to be applied to the die 10 as juxtaposed layer. According to the principles of the invention the surface area cover 23 is substantially coextensive with the defined area 17 to be covered and sealed on the die 10. The area enclosed by the epoxy adhesive 27 includes surface area 15, enclosing the electrical operative surface 17. However, it should be understood that the defined area can be expanded or reduced further to the limits of any area which requires environmental sealant. When the cover 23 is brought in contact with the adhesive 27 on die 10's semiconductor 13's surface 15, or sandwich is created. In this sandwich, the sealant 27 overlying the contacts 19 and filling the voids or spaces 25 between the contacts 19, forms a seal where it contacts the undersurface 22 of cover 23. Alternatively, the sealant 27 initially may be placed on the matching interior surface 22 of the cover 23 as shown in the exploded view of FIG. 5. The seal may be more advantageously viewed in the edge view of FIG. 6. As shown, the adhesive bead 27 in cooperation with cover 23 and the surface 15 of substrate 13 seals and blocks any communication between the electrically operative surface 17 and the environment exterior to that surface 17. As will be understood by those skilled in the art, the view from any other side of substrate 13 would be substantially similar.

As shown, the principles of the invention may be applied to reducing the size of an electrical component to substantially to that of its electrical area. In operation, the cover should be the same material as the die 10 or a suitably compatible material, such as one having for example a matching coefficient of thermal expansion.

Figure 7A:
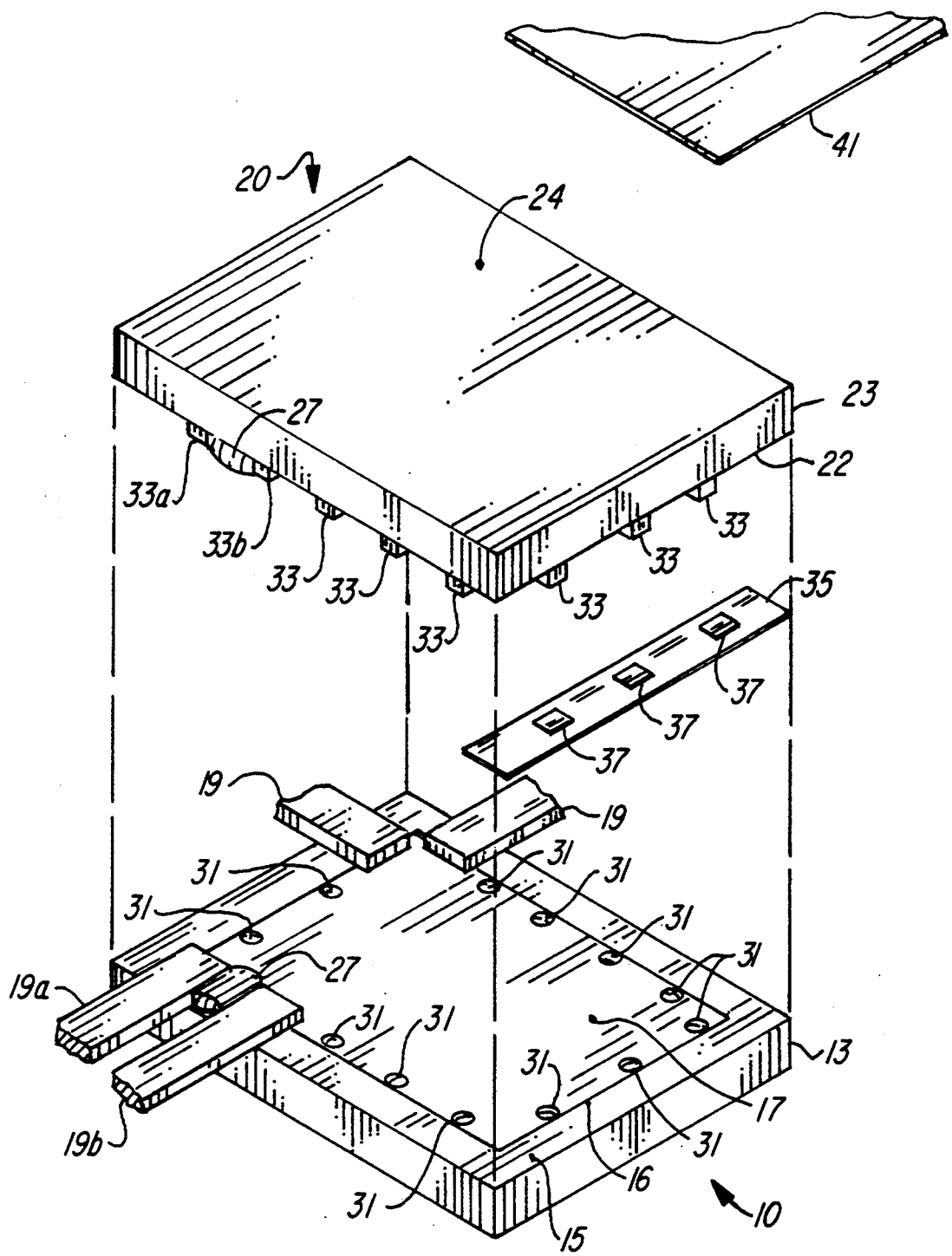
FIG. 7a shows the die and a second die serving as a cover, with each containing a circuit, and with sealing material, in an exploded view.

FIG. 7a shows an exploded view of the die 10 with a cover 23 juxtaposed in a layered relationship over die 10. The cover 23, in this embodiment forms a second die 20, having constructed on its under surface 22 an electrical component. The connections from the electrical component in die 10 may be more clearly seen in FIG. 7a as through the conductive bumps 31. The manner of constructing these bumps and the connection to the electrical component within defined surface area 17 is well known in the art. The contacts 19 are attached to the bumps 31 and the electrical component of die 10 may then be connected to other electrical components. In the same or similar manner, the contacts 33 for the electrical component of die 20 are constructed. This construction may be better viewed in FIG. 7b. In the view of FIG. 7b, the bumps 31 on dice 10 and 20 are shown connected to their respective contacts 19 and 33. The contacts 33 are shown for the preferred embodiment, it being understood the shape of the contacts can be varied to meet the physical needs of the specific application. Alternatively contact between the die 10 and 20 may be made directly by the direct connection of contacts or by any other suitable method, including reflow of solder or aluminum.

As shown in FIG. 7a, the sealant 27 may be placed between the contacts 33 or 19. In FIG. 7a, sealant 27 is shown between contacts 19a and 19b, or between contacts 33a and 33b. In the construction of the embodiment of FIG. 7a, the electrical components of die 10 and 20 are designed to cooperate with each other to form an electrical system. Accordingly, designated contacts of die 10 will be arranged to be placed to contact respective matching contacts of die 20 to permit the cooperative use of the circuits on the two dice. For example, the matching contacts may be respective I/O ports for passing the signals required for interoperation of the dice 10 and 20 circuits. The contacts 19 are shaped to provide electrical contacts as required to the environment exterior to the sealed space formed by die 10 and die 20, the contacts 19 and 33 and the sealant.

FIG. 7b shows the die 20 placed over die for sealing and electrical connection. In this edge view, the placement of the sealant is omitted for clarity. The completed layered composite or sandwich is shown in edge view in FIG. 7c. As shown the interior of the sandwich formed by die 10 and die 20 is sealed from the environment by the sealant 27 in cooperation with the contacts 19 and 33. The sealant may be applied on a strip shown as strip 35 in FIG. 7a. To avoid shorting any of the contacts 33 or 19, the strip may contain conductive adhesive 37 for bonding with the contacts 19 and 33 and sealing in the proximity of these contacts. In between the conductive adhesive 37 may be placed non-conductive sealant which seals the interior of the layered composite or sandwich formed by die 10 and die 20 and insulated the contacts 19 and 33. Alternatively, a sealant which conducts only in the Z axis direction, as shown in FIG. 7c may be used, according to the principles of the invention, to seal the interior of the space between die 10 and die 20. As this material conducts only in the direction between the dice, short circuits are avoided and the required contacts between matching terminals of the dice are made.

The electrical components on die 10 and die 20 when assembled into a layered composite, may form a system or subsystem of a larger system. In this way, a system employing electrical components incapable of being assembled on a single integrated circuit or on a single semiconductor material may be assembled without exterior packaging and with a size limited to the surface area of each of the dice. For example, circuits using different voltage levels such a power handler and controller may be so assembled. Other examples are digital and analogue components, high frequency and low frequency components, reference generators and frequency synthesizers, discrete power transistors and associated control circuits.

Further, as shown in FIG. 7a, a thermally conductive sheet 41 may be placed between the dice to promote the transfer of heat, to the bottom die 10 for example and out of the composite and the system. Additionally, multilayers may be added, increasing the complexity of the systems without adding to the surface area.

I claim:

1. A product made by the process of sealing a first electrical component, contained within a first defined area on the surface of a first semiconductor material with cover having a second electrical component and forming a sealed unit having the area of said first semiconductor by:
    a. connecting to said first electrical component, electrical contacts including electrical contacts extending outside said sealed unit for the direct connection of said first electrical component to a separate electrical component outside said sealed unit;
    b. forming a cover having a second defined area and having the dimensions and area of said first semiconductor;
    c. forming said cover of a second semiconductor material;
    d. forming in said second defined area of said second semiconductor material a second electrical component;
    e. connecting to said second electrical component, second electrical contacts;
    f. aligning electrical contacts of said first electrical component with matching contacts of said second electrical contacts;
    g. applying a non-conductive sealant between said electrical contacts of said first and second set of electrical contacts and applying a conductive sealant on the contacting surfaces of said matching contacts of said first and second set of electrical contacts;

h. aligning the dimensions of said second semiconductor material with the dimensions of the first semiconductor material;

i. applying said second semiconductor material to said first semiconductor material in a layered relationship to form a sealed unit.

2. A semiconductor sealed unit with first and second semiconductor materials and having an area of the first semiconductor material comprising;

a first semiconductor material;

a defined area on said first semiconductor material, forming a first semiconductor defined area;

a first electrical component within said first semiconductor defined area;

said first electrical component having a first set of electrical contacts;

a cover made of a second semiconductor material having the same area and dimensions as said first semiconductor material;

a defined area on said second semiconductor material and a second electrical component within the second semiconductor defined area;

said second electrical component having a second set of electrical contacts;

a sealant;

said sealant, said cover, said first semiconductor material being placed in a layered relationship with said sealant between opposed surfaces of said cover and said first semiconductor defined area, with the dimensions of said cover in alignment with the dimensions of said first semiconductor defined area and forming a sealed unit having substantially the same area as the first semiconductor defined area;

and wherein said first set of electrical contacts is in contact with said second set of electrical contacts and forms an integrated circuit of said first electrical component on said first semiconductor material and said second electrical component on said second semiconductor material.

* * * * *